US008231733B2

(12) United States Patent
Egbe et al.

(10) Patent No.: US 8,231,733 B2
(45) Date of Patent: Jul. 31, 2012

(54) AQUEOUS STRIPPING AND CLEANING COMPOSITION

(75) Inventors: Matthew I. Egbe, West Norriton, PA (US); Darryl W. Peters, Stewartsville, NJ (US)

(73) Assignee: Air Products and Chemicals, Inc., Allentown, PA (US)

( * ) Notice: Subject to any disclaimer, the term of this patent is extended or adjusted under 35 U.S.C. 154(b) by 0 days.

(21) Appl. No.: 11/139,950

(22) Filed: May 27, 2005

(65) Prior Publication Data

US 2005/0217697 A1 Oct. 6, 2005

Related U.S. Application Data

(62) Division of application No. 10/042,612, filed on Jan. 9, 2002, now Pat. No. 6,943,142.

(51) Int. Cl.
    C23G 1/00     (2006.01)
    C23G 1/02     (2006.01)
    B08B 3/00     (2006.01)

(52) U.S. Cl. .............. 134/3; 134/2; 134/36; 134/41; 134/902

(58) Field of Classification Search ............. 134/3, 2, 134/25.4, 28, 40, 42; 510/175, 176, 461, 510/492, 493, 495; 216/108; 438/906; 252/364
See application file for complete search history.

(56) References Cited

U.S. PATENT DOCUMENTS

| | | | |
|---|---|---|---|
| 3,653,931 A | 4/1972 | Borchert et al. | |
| 3,887,497 A | 6/1975 | Ulvild | |
| 3,915,902 A | 10/1975 | Ancel et al. | |
| 4,165,295 A | 8/1979 | Vander Mey | |
| 4,199,483 A | 4/1980 | Jones | |
| 4,215,005 A | 7/1980 | Vander Mey | |
| 4,221,674 A | 9/1980 | Vander Mey | |
| 4,242,218 A | 12/1980 | Vander Mey | |
| 4,304,681 A * | 12/1981 | Martin et al. | 510/176 |
| 4,321,166 A | 3/1982 | McGrady | |
| 4,491,530 A * | 1/1985 | Thomas | 510/176 |
| 4,617,251 A | 10/1986 | Sizensky | |
| 5,073,478 A * | 12/1991 | Banks et al. | 430/317 |
| 5,308,745 A | 5/1994 | Schwartzkopf | |
| 5,534,177 A | 7/1996 | Mayhan | |
| 5,728,664 A * | 3/1998 | Michelotti | 510/176 |
| 5,863,346 A * | 1/1999 | Michelotti | 134/3 |
| 5,888,308 A | 3/1999 | Sachdev et al. | |
| 5,972,862 A * | 10/1999 | Torii et al. | 510/175 |
| 6,152,969 A | 11/2000 | Matsumoto et al. | |
| 6,231,677 B1 | 5/2001 | Ishikawa et al. | |
| 6,232,283 B1 | 5/2001 | Inoue et al. | |
| 6,417,112 B1 | 7/2002 | Peyne et al. | |
| 6,486,115 B1 | 11/2002 | Weaver et al. | |
| 6,498,131 B1 * | 12/2002 | Small et al. | 510/175 |
| 6,674,054 B2 * | 1/2004 | Boyers | 219/628 |
| 6,831,048 B2 | 12/2004 | Kezuka et al. | |
| 2002/0055447 A1 * | 5/2002 | Ishikawa et al. | 510/175 |
| 2002/0107158 A1 * | 8/2002 | Peters et al. | 510/175 |

FOREIGN PATENT DOCUMENTS

| | | | |
|---|---|---|---|
| GB | 2021285 | * | 11/1979 |
| JP | 9-244263 | * | 9/1997 |
| JP | 11125917 A | | 5/1999 |
| JP | 2000206709 | | 7/2000 |
| WO | 9850516 | | 11/1998 |

* cited by examiner

*Primary Examiner* — Michael Kornakov
*Assistant Examiner* — Nicole Blan
(74) *Attorney, Agent, or Firm* — Rosaleen P. Morris-Oskanian; Joseph D. Rossi; Anne B. Kiernan

(57) ABSTRACT

The present invention relates to a method used to remove post etch organic and inorganic residue as well polymeric residues and contaminants from semiconductor substrates. In one aspect, the method involves contacting the substrate with a composition are comprised of a water soluble organic solvent, a sulfonic acid and water.

19 Claims, No Drawings

AQUEOUS STRIPPING AND CLEANING COMPOSITION

CROSS-REFERENCE TO RELATED APPLICATIONS

This application is a divisional of application Ser. No. 10/042,612, filed 9 Jan. 2002, now U.S. Pat. No. 6,943,142, which is incorporated herein by reference in its entirety.

STATEMENT REGARDING FEDERALLY FUNDED SPONSORED RESEARCH OR DEVELOPMENT

Not Applicable

BACKGROUND OF THE INVENTION

In the manufacture of semiconductors or semiconductor microcircuits it is necessary to remove materials from the surface of the substrate of the semiconductor device. In some instances the materials to be removed are polymeric compositions referred to as photoresists. In other instances the materials to be removed are residues of etching or ashing processes or simply contaminants. The purpose of stripping and/or cleaning compositions is to remove unwanted materials from a semiconductor substrate without corroding, dissolving or dulling the exposed surface of the substrate.

The art contains numerous references to compositions of different types for use in stripping photoresist and/or cleaning etch residue, ash or other contaminants from semiconductor substrates. For example a series of patents issued to Allied Signal disclose nonaqueous organic stripping compositions comprising one or more organic sulfonic acids in conjunction with organic solvents and various improvements. The first patent in the series U.S. Pat. No. 4,165,295 discloses a composition for removing polymeric organic substances such as photoresist comprising one or more organic, sulfonic acids one or more organic solvents, optionally a phenol and from about 5 to 250 ppm of a fluoride ion. The second patent U.S. Pat. No. 4,215,005 provides an improvement in the composition where in the fluoride is present in conjunction with a complexing agent having a nitrogen with an available unshared electron pair. The third patent in the series U.S. Pat. No. 4,221,674 provides another improvement in the composition where between 0.01 to 5 weight % of a nitrile compound is added to the composition. The fourth patent in the series U.S. Pat. No. 4,242,218 comprises a phenol free stripping composition comprising a sulfonic acid in admixture with chlorinated aryl compounds, alkylaryl compounds having 1–14 alkyl carbon atoms an isoparaffinic hydrocarbon or mixtures thereof.

U.S. Pat. No. 5,308,745 discloses alkaline containing photoresist stripping compositions having reduced metal corrosion containing non-nitrogen containing weak acids having a pK in an aqueous solution of 2.0 or higher and an equivalent weight of less than about 140. The weak acids are employed in an amount that will neutralize from 19% to 75% of the amine present in the composition. U.S. Pat. No. 5,972,862 discloses a cleaning liquid for semiconductor devices comprising a fluoride containing compound, a water soluble organic solvent, inorganic or organic acids and optionally a quaternary ammonium salt or carboxylic acid ammonium salt and/or organic carboxylic acid amine salt. U.S. Pat. No. 6,231,677 discloses the use of one or more carboxylic acids in stripping compositions. WO 00/02238 discloses a cleaning chemistry based on a choline compound such as choline hydroxide. The compositions are comprised of a choline compound, water and an organic solvent. The compositions may in addition contain hydroxyl amine and a corrosion inhibitor.

BRIEF SUMMARY OF THE INVENTION

The invention relates to aqueous compositions used to remove photoresist, etch and ash residue and contaminants from semiconductor substrates. The aqueous compositions have a low surface tension, low viscosity and are compatible with various substrates including Al/Cu, Cu, Ti, W, Ta, TiN, W, TaN, low-k materials such as methylsilsesquioxane (MSQ), black diamond, SiLK and high-k materials such as Pt/BST/oxide. BST is barium-strontium-tantanate. The compositions contain a water soluble organic solvent, a sulfonic acid, water and optionally corrosion inhibitors. The compositions of the invention are free of fluoride containing compounds and inorganic amines.

BRIEF DESCRIPTION OF SEVERAL VIEWS OF THE DRAWINGS

Not applicable

DETAILED DESCRIPTION OF THE INVENTION

The invention relates to aqueous compositions used to remove photoresist, etch and ash residue and contaminants from semiconductor substrates. The compositions are comprised of a water soluble organic solvent that is soluble in water, a sulfonic acid or its corresponding salt, water and optionally a corrosion inhibitor.

The water soluble organic solvent includes organic amines, amides, sulfoxides, sulfones, lactams, imidazolidinones, lactones, polyhydric alcohols and the like. Examples of organic amines include monoethanolamine, N-methylethanolamine, ethylenediamine, 2-(2-aminoetylamino)ethanol, diethanolamine, dipropylamine, 2-ethylaminoethanol, dimethylaminoethanol, cyclohexylamine, benzylamine, pyrrole, pyrrolidine, pyridine, morpholine, piperidine, oxazole and the like. Examples of amides includes N,N-dimethylformamide, dimethylacetamide, diethylacetamide and the like. Examples of sulfoxides include dimethyl sulfoxide. Examples of sulfones include dimethyl sulfone and diethyl sulfone. Examples of lactams includes N-methyl-2-pyrrolidone and imidazolidinone. Examples of lactones includes butyrolactone and valerolactone. Examples of polyhydric alcohols includes ethylene glycol, propylene glycol, ethylene glycol monomethyl ether acetate, etc. Examples of preferred water soluble organic solvents includes monoethanolamine, N-methylethanolamine, dimethylsulfoxide and dimethylacetamide. The water soluble organic solvent can be present as a single compound or mixture of compounds. The water soluble organic solvent is present in the composition in amounts of from 30 to 90 weight %, preferably from 40 to 85 weight %, most preferably from 45 to 80 weight % based on the total weight of the composition.

In addition to the water soluble organic solvent, the compositions also contain a sulfonic acid or its corresponding salts. Examples of suitable sulfonic acids include p-toluenesulfonic acid, 1,5-naphthalenedisulfonic acid, 4-ethylbenzenesulfonic acid, dodecylbenzenesulfonic acid, cumensulfonic acid, methylethylbenzenesulfonic acid, isomers of xylenesulfonic acid and the corresponding salts of the sulfonic acids listed above. Examples of salts of sulfonic acids includes ethanolammonium p-toluenesulfonate and triethanolammonium p-toluenesulfonate. The sulfonic acid or its corresponding salts can be present in the compositions as a single acid or salt, or mixture of sulfonic acids or corresponding salts. The sulfonic acid or corresponding salt is present in amounts of from 1 to 20 wt %, preferably from 1.5 to 15 wt %, most preferably 3 to 10 wt % based on the total weight of the composition. Water is a necessary component of the stripping and cleaning compositions of the present invention. Water is present in amounts from 5 to 50 wt %, preferably 5 to 35 wt %, most preferably from 10 to 30 wt % based on the total weight of the composition.

Optionally, the stripping and cleaning compositions contain a corrosion inhibitor. A single corrosion inhibitor compound or mixture of corrosion inhibitors can be used in the stripping and cleaning compositions. Examples of corrosion inhibitors includes benzotriazole, benzoic acid, malonic acid, gallic acid, catechol, ammonium malonate, and the like. The corrosion inhibitor is present in the stripping and cleaning compositions in amounts up to 20 wt %, preferrably from 0.1 to 15 wt %, based on the total weight of the stripping and cleaning composition.

Other commonly known components such as dyes, biocides etc. can be included in the stripper and cleaner compositions in amounts up to a total of 5 wt % based on the total weight of the composition.

The stripper and cleaner compositions of the present invention are typically prepared by mixing the components together in a vessel at room temperature until all solids have dissolved. Examples of the aqueous stripper and cleaner compositions of the present invention are set forth in Table 1.

Following are nonlimiting examples of the uses of the compositions of the invention.

EXAMPLE 1

A positive photoresist was spin-coated on to a substrate of chemical-vapor-deposited Al—Cu film on silicon wafer. The positive photoresist consisted of diazonaphthoquinone and novolak resin. The photoresist coating was baked at 90° C. for 90 seconds. A pattern was defined on the photoresist by exposure, through a patterned mask, to i-line (365 nm) rays followed by development. The patterned wafer was plasma etched with $Cl_2/BCl_3$ etch gas mixture for 168 seconds at 5 torr of pressure and 20° C. The etched pattern was subjected to oxygen plasma ash for 55 seconds at 0.3 torr pressure and 65° C.

The patterned and ashed wafer was treated by immmersing the wafer in a bath containing formulation 3 from table 1 for 30 minutes at 65° C. Analysis of the cleaned wafer was done by inspection of SEM pictures of the wafers. The SEM photographs showed that the wafer was clean and free of residue and there was no evidence of corrosion.

EXAMPLE 2

A TEOS (tetraethoxysilicate) was coated on a TiN antireflective coating (ARC) layer which in turn was coated on Al—Cu layer which was chemically deposited on a silicon wafer. A positive photoresist layer was spin-coated on the TEOS layer. The photoresist coated was baked at 90° C. for

TABLE I

| | Compound/Formulation # | | | | | | | | | | | | |
|---|---|---|---|---|---|---|---|---|---|---|---|---|---|
| | 1 | 2 | 3 | 4 | 5 | 6 | 7 | 8 | 9 | 10 | 11 | 12 | 13 |
| MEA | 70.0 | 71.0 | 70.0 | — | 70.0 | 70.0 | 70.0 | 72.0 | — | — | 71.0 | 73.5 | 72.0 |
| NMEA | — | — | — | 70.0 | — | — | — | — | — | — | — | — | — |
| DMSO | — | — | — | — | — | — | — | — | 71.0 | — | — | — | — |
| DMAc | — | — | — | — | — | — | — | — | — | 71.0 | — | — | — |
| ToSA | 7.0 | 7.0 | 7.0 | — | 7.0 | 7.0 | 7.0 | 7.0 | 7.0 | 7.0 | — | 7.0 | — |
| NDSA | — | — | — | 5.0 | — | — | — | — | — | — | — | — | — |
| EBSA | — | — | — | — | — | — | — | — | — | — | 7.0 | — | — |
| DBSA | — | — | — | — | — | — | — | — | — | — | — | — | 5.0 |
| Deionized Water | 20.5 | 19.5 | 19.5 | 23.0 | 22.0 | 21.5 | 21.0 | 19.0 | 19.5 | 19.5 | 19.5 | 19.5 | 20.5 |
| Gallic Acid | 1.5 | 1.5 | 1.5 | 1.0 | — | 0.5 | 1.0 | 1.0 | 1.5 | 1.5 | 1.5 | — | 1.5 |
| Benzotriazole | 1.0 | 1.0 | 1.0 | 1.0 | 1.0 | 1.0 | 1.0 | 1.0 | 1.0 | 1.0 | 1.0 | — | 1.0 |

MEA = monoethanolamine
NMEA = N-methylethanolamine
DMSO = dimethylsulfoxide
DMAc = dimethylacetamide
ToSA = p-toluene sulfonic acid
NDSA = 1,5-Naphthalenedisulfonic acid
EBSA = 4-ethylbenzene sulfonic acid
DBSA = Dodecylbenzene sulfonic acid The aqueous stripping and cleaning compositions are used to remove post etch and ash, organic and inorganic residues as well as polymeric residues from semiconductor substrates at low temperatures with low corrosion. In general, the stripping and cleaning processes using the compositions of the invention are carried out by immersing a substrate in the stripper/cleaner composition at a temperature of from 25° C. to 85° C. for a period of from 3 minutes to 1 hour. However, the compositions of the present invention can be used in any method known in the art that utilizes a liquid for removal of photoresist, ash or etch residues and/or contaminants.

90 seconds. A pattern was defined on the photoresist by exposure to i-line rays through a patterned mask followed by development. A two step plasma process was used to transfer the pattern from the resist to the substrate. The first step involved the subjecting the wafer to $CO/CF_4/Ar/CHF_3$ plasma etch gas mixture for the TEOS layer and in-situ followed immediately by $Ar/CF_4/O_2$ for the TiN ARC layer. The etched pattern was ashed with oxygen plasma for 150 seconds at 0.3 torr pressure and 60° C. The etched and ashed wafer was treated by immersing the wafer in a bath containing formulation 3 for 30 minutes at 65° C. Analysis of the cleaned wafer was done by inspecting a SEM picture of the wafer. The SEM showed that the wafer was clean and free of residue and there was no evidence of corrosion.

The invention claimed is:

1. A method of removing etch and/or ash residue from a semiconductor substrate, comprising: contacting the semiconductor substrate for a period of time sufficient to remove the etch and/or ash residue with a composition consisting essentially of:
   a. from 45 wt % to 90 wt % of a water soluble organic solvent,
   b. from 3 wt % to 10 wt % of a salt of a sulfonic acid, wherein the sulfonic acid is selected from the group consisting of p-toluene sulfonic acid, 1,5-naphthalene disulfonic acid, 4-ethylbenzene sulfonic acid, and mixtures thereof; and
   c. from 5 wt % to 50 wt % water, wherein all of the ingredients contained in the composition are dissolved, and wherein the salt of a sulfonic acid is present in the composition in an effective amount to remove etch and/or ash residue from the semiconductor substrate.

2. The method of claim 1, wherein the water soluble organic solvent is monoethanolamine, N-methylethanolamine, dimethylsulfoxide, dimethylacetamide or mixtures thereof.

3. The method of claim 2 wherein the water soluble organic solvent is monoethanolamine or N-methylethanolamine.

4. A method of removing etch and/or ash residue from a semiconductor substrate, comprising;
   contacting the semiconductor substrate for a period of time sufficient to remove the etch and/or ash residue with a composition consisting essentially of:
   a. from 45 wt % to 90 wt % of a water soluble organic solvent,
   b. from 3 wt % to 10 wt % of a salt of a sulfonic acid, wherein the sulfonic acid is selected from the group consisting of p-toluene sulfonic acid, 1,5-naphthalene disulfonic acid, 4-ethylbenzene sulfonic acid, and mixtures thereof; and
   c. from 5 wt % to 50 wt % water wherein all the ingredients contained in the composition are dissolved and wherein the composition is free of a fluoride-containing compound.

5. The method of claim 4, wherein the composition further contains a corrosion inhibitor.

6. The method of claim 5, wherein the corrosion inhibitor is gallic acid, catechol, benzotriazole, benzoic acid, mallonic acid, ammonium malonate or mixtures thereof.

7. The method of claim 4, wherein the water soluble organic solvent is monoethanolamine, N-methylethanolamine, dimethylsulfoxide, dimethylacetamide or mixtures thereof.

8. The method of claim 7, wherein the water soluble organic solvent is monoethanolamine or N-methylethanolamine.

9. A method of removing etch and/or ash residue from a semiconductor substrate, comprising the step of contacting the semiconductor substrate for a period of time sufficient to remove the etch and/or ash residue with a composition consisting essentially of:
   from 45 wt % to 90 wt % of a water soluble organic solvent,
   from 3 wt % to 10 wt % of a salt of a sulfonic acid, wherein the sulfonic acid is selected from the group consisting of p-toluene sulfonic acid, 1,5-naphthalene disulfonic acid, 4-ethylbenzene sulfonic acid, and mixtures thereof;
   from 5 wt % to 50 wt % water, wherein all of the ingredients contained in the composition are dissolved, and wherein the salt of a sulfonic acid is present in the composition in an effective amount to remove etch and/or ash residue from the semiconductor substrates; and corrosion inhibitor.

10. The method of claim 9, wherein the corrosion inhibitor is gallic acid, catechol, benzotriazole, benzoic acid, mallonic acid, ammonium malonate or mixtures thereof.

11. The method of claim 9, wherein the water soluble organic solvent is monoethanolamine, N-methylethanolamine, dimethylsulfoxide, dimethylacetamide or mixtures thereof.

12. The method of claim 11 wherein the water soluble organic solvent is monoethanolamine or N-methylethanolamine.

13. The method of claim 12 wherein the salt of a sulfonic acid is an amine salt formed in situ upon addition of the water soluble organic solvent.

14. A method of removing etch and/or ash residue from a semiconductor substrate, comprising: contacting the semiconductor substrate for a period of time sufficient to remove the etch and/or ash residue with a composition comprising:
   a. from 45 wt % to 90 wt % of a water soluble organic solvent,
   b. from 3 wt % to 10 wt % of a salt of a sulfonic acid, wherein the sulfonic acid is one selected from the group consisting of p-toluene sulfonic acid, 1,5-naphthalene disulfonic acid, and 4-ethylbenzene sulfonic acid; and
   c. from 5 wt % to 50 wt % water, wherein all of the ingredients contained in the composition are dissolved, and wherein the salt of a sulfonic acid is present in the composition in an effective amount to remove etch and/or ash residue from the semiconductor substrate.

15. The method of claim 14 wherein the water soluble organic solvent comprises an organic amine.

16. The method of claim 15 wherein the organic amine comprises at least one selected from the group consisting of monoethanolamine, N-methylethanolamine, ethylenediamine, 2-(2-aminoetylamino)ethanol, diethanolamine, dipropylamine, 2-ethylaminoethanol, dimethylaminoethanol, cyclohexylamine, benzylamine, pyrrole, pyrrolidine, pyridine, morpholine, piperidine, oxazole and combinations thereof.

17. The method of claim 14 wherein the water soluble organic solvent comprises an organic amide.

18. The method of claim 17 wherein the organic amide comprises at least one selected from the group consisting of N,N-dimethylformamide, dimethylacetamide, diethylacetamide and combinations thereof.

19. A method of removing etch and/or ash residue from a semiconductor substrate, comprising: contacting the semiconductor substrate for a period of time sufficient to remove the etch and/or ash residue with a composition comprising:
   a. from 45 wt % to 90 wt % of a water soluble organic solvent comprising an organic amine,
   b. from 3 wt % to 10 wt % of a salt of a sulfonic acid, wherein the sulfonic acid is one selected from the group consisting of p-toluene sulfonic acid, 1,5-naphthalene disulfonic acid, and 4-ethylbenzene sulfonic acid; and
   c. from 5 wt % to 50 wt % water, wherein all of the ingredients contained in the composition are dissolved, and wherein the salt of a sulfonic acid is present in the composition in an effective amount to remove photoresist, etch and/or ash residue from the semiconductor substrate.

* * * * *

UNITED STATES PATENT AND TRADEMARK OFFICE
CERTIFICATE OF CORRECTION

PATENT NO. : 8,231,733 B2
APPLICATION NO. : 11/139950
DATED : July 31, 2012
INVENTOR(S) : Matthew I. Egbe and Darryl W. Peters It is certified that error appears in the above-identified patent and that said Letters Patent is hereby corrected as shown below:

In the Claims:

Column 5, Line 29

In claim 4 delete ";" and insert --:--

Column 6, Line 3

In claim 9 after "and" insert --a--

Signed and Sealed this
Fifteenth Day of October, 2013

Teresa Stanek Rea
*Deputy Director of the United States Patent and Trademark Office*